United States Patent
Siegert

(10) Patent No.: US 9,634,689 B2
(45) Date of Patent: Apr. 25, 2017

(54) METHOD AND SYSTEM FOR ARRANGING NUMERIC DATA FOR COMPRESSION

(71) Applicant: SunEdison Semiconductor Limited (UEN201334164H), Singapore (SG)

(72) Inventor: Markus Jan Peter Siegert, Key West, FL (US)

(73) Assignee: SunEdison Semiconductor Limited (UEN201334164H), Singapore (SG)

( * ) Notice: Subject to any disclaimer, the term of this patent is extended or adjusted under 35 U.S.C. 154(b) by 240 days.

(21) Appl. No.: 14/464,301

(22) Filed: Aug. 20, 2014

(65) Prior Publication Data

US 2016/0056840 A1    Feb. 25, 2016

(51) Int. Cl.
*G06F 7/38* (2006.01)
*H03M 7/30* (2006.01)

(52) U.S. Cl.
CPC ..................................... *H03M 7/30* (2013.01)

(58) Field of Classification Search
CPC .. H03M 7/3084; G06F 3/0641; G06F 3/0643; G06F 3/0689; G06F 3/0608; G06F 3/0665; G06F 7/483
USPC .................. 711/114; 708/203, 495
See application file for complete search history.

(56) References Cited

U.S. PATENT DOCUMENTS

| | | | |
|---|---|---|---|
| 5,488,364 A * | 1/1996 | Cole | H03M 7/30 341/50 |
| 6,501,395 B1 * | 12/2002 | Ghildiyal | H03M 7/30 341/50 |
| 7,447,814 B1 | 11/2008 | Ekman | |
| 8,208,532 B2 | 6/2012 | Ekman | |
| 8,239,421 B1 * | 8/2012 | Marwah | H03M 7/30 382/245 |
| 9,354,319 B2 * | 5/2016 | Ferguson | G01S 19/03 |
| 2005/0179569 A1 * | 8/2005 | Cockburn | H03M 7/3086 341/51 |
| 2005/0240604 A1 * | 10/2005 | Corl, Jr. | H03M 7/30 |
| 2010/0017424 A1 * | 1/2010 | Hughes | H03M 7/3086 707/E17.005 |
| 2010/0085253 A1 * | 4/2010 | Ferguson | G01S 19/04 342/357.41 |
| 2011/0055860 A1 * | 3/2011 | Ramaswamy | H04N 21/235 725/14 |
| 2013/0007078 A1 * | 1/2013 | Wegener | G06F 7/483 708/203 |
| 2016/0056840 A1 * | 2/2016 | Siegert | H03M 7/3084 711/114 |

* cited by examiner

*Primary Examiner* — Yong Choe
*Assistant Examiner* — Tasnima Matin
(74) *Attorney, Agent, or Firm* — Armstrong Teasdale LLP

(57) ABSTRACT

A computer-implemented method for arranging numeric data for compression is described. The method is implemented using a computing device in communication with a memory and a measurement device. The method includes receiving, by the computing device and from the measurement device, numeric data that includes a sequence of numbers, each number including at least a first byte followed by a second byte. The method additionally includes arranging the first bytes into a first contiguous set, arranging the second bytes into a second contiguous set, and storing the first contiguous set and the second contiguous set in a file in the memory, such that the first contiguous set is contiguous with the second contiguous set.

15 Claims, 8 Drawing Sheets

METHOD AND SYSTEM FOR ARRANGING NUMERIC DATA FOR COMPRESSION

FIELD

The field relates generally to compression of data, and more particularly to systems and methods for arranging numeric data prior to compressing the numeric data, to obtain increased compression.

BACKGROUND

At least some known systems include one or more measurement devices that generate measurement data, such as a sequence of numbers representing temperatures, pressures, or other conditions over time. Compression of such numbers for storage and/or transmission to one or more other computing devices becomes increasingly important as the amount of measurement data generated increases. Known compression algorithms, such as Lempel-Ziv compression algorithms, compress such measurement data to a degree. However, further compression of such measurement data would be beneficial in order to reduce the amount of storage capacity and/or transmission bandwidth required for the measurement data to be stored and/or transmitted.

BRIEF DESCRIPTION

In one aspect, a computer-implemented method for arranging numeric data for compression is provided. The method is implemented using a computing device in communication with a memory and a measurement device. The method includes receiving, by the computing device and from the measurement device, numeric data that includes a sequence of numbers, each number including at least a first byte followed by a second byte. The method additionally includes arranging the first bytes into a first contiguous set, arranging the second bytes into a second contiguous set, and storing the first contiguous set and the second contiguous set in a file in the memory, such that the first contiguous set is contiguous with the second contiguous set.

In another aspect, a system for arranging numeric data for compression is provided. The system includes a computing device coupled to a memory. The computing device is configured to receive, from the measurement device, numeric data that includes a sequence of numbers. Each number includes at least a first byte followed by a second byte. The computing device is additionally configured to arrange the first bytes into a first contiguous set, arrange the second bytes into a second contiguous set, and store the first contiguous set and the second contiguous set in a file in the memory, such that the first contiguous set is contiguous with the second contiguous set.

In another aspect, a computer-readable storage medium having computer-executable instructions embodied thereon is provided. When executed by a computing device having a processor in communication with a memory, the computer-executable instructions cause the computing device to receive, from the measurement device, numeric data that includes a sequence of numbers. Each number includes at least a first byte followed by a second byte. The instructions additionally cause the computing device to arrange the first bytes into a first contiguous set, arrange the second bytes into a second contiguous set, and store the first contiguous set and the second contiguous set in a file in the memory, such that the first contiguous set is contiguous with the second contiguous set.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Like reference symbols in the various drawings indicate like elements.

DETAILED DESCRIPTION

Figure 1:
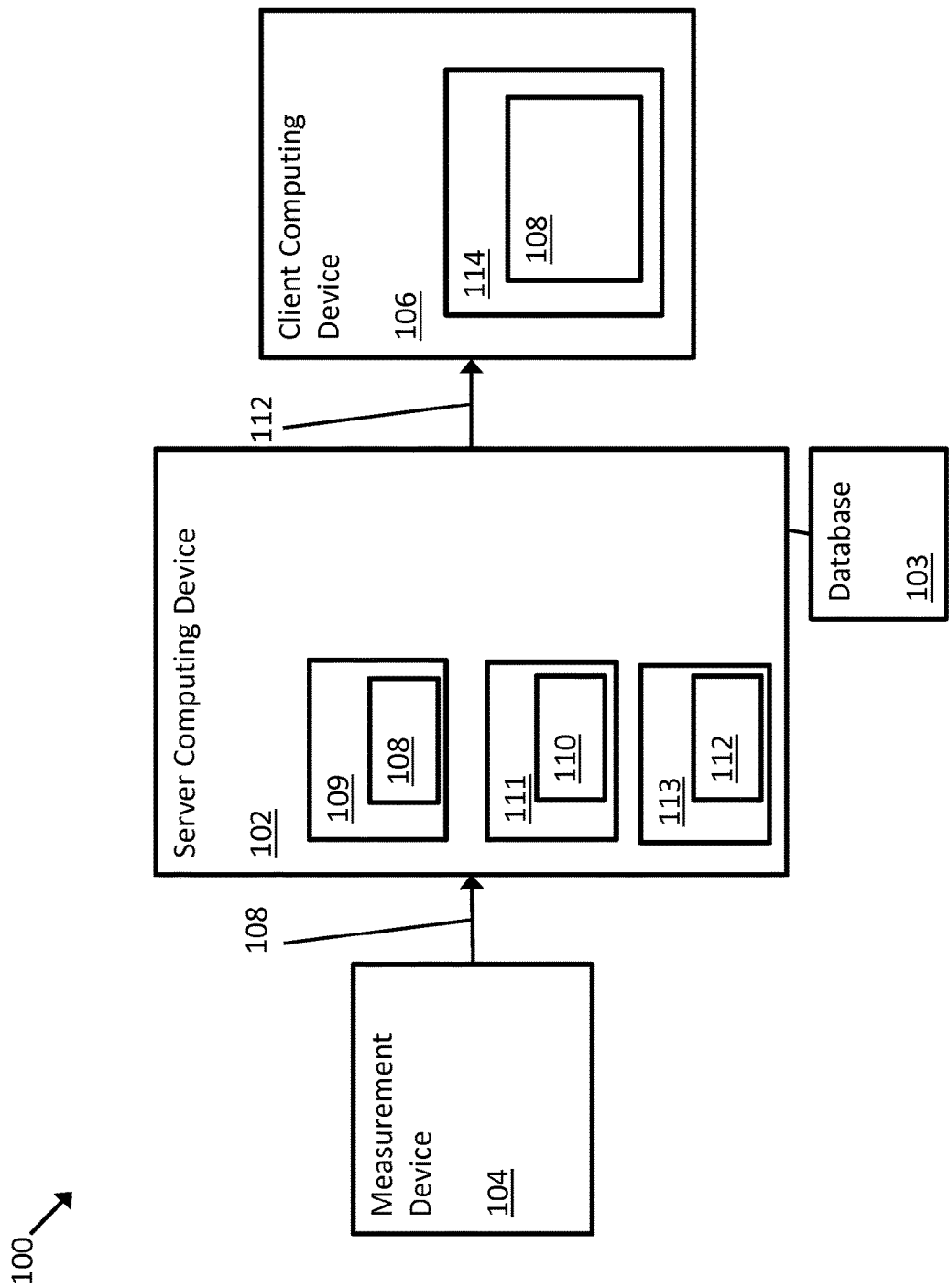
FIG. 1 is a diagram of an example environment that includes a server computing device in communication with a measurement device and a client computing device.

FIG. 1 is a diagram of an environment 100 that includes a server computing device 102 in communication with a measurement device 104 and a client computing device 106. In some implementations, server computing device 102 includes or is in communication with a database 103. Measurement device 104 transmits numeric data 108, for example measurements of one or more physical conditions, such as a temperature, a pressure, or a position. In some implementations, numeric data 108 includes floating point numbers, for example in a format defined by the Institute of Electrical and Electronics Engineers (IEEE) in the IEEE standard for floating-point arithmetic (IEEE 754). In other implementations, numeric data 108 includes numbers in other formats, such as integers and/or fixed-point numbers. Server computing device 102 receives numeric data 106 and stores numeric data 108 in memory 306 (FIG. 3), for example as an input file 109. Server computing device 102 rearranges numeric data 108, as described in more detail herein, and stores the rearranged numeric data 110 in memory 306 (FIG. 3), for example in an intermediate file 111. Server computing device 102 then compresses the rearranged numeric data 110, for example by compressing intermediate file 111, to generate compressed numeric data 112. In some implementations, server computing device 102 stores compressed numeric data 112 in a compressed file 113. In some implementations, server computing device 102 transmits compressed numeric data 112 to client computing device 106. For example, in some implementations, client computing device 106 decompresses and rearranges compressed numeric data 112 to obtain numeric data 108, and displays numeric data 108 in a user interface 114.

Figure 2:
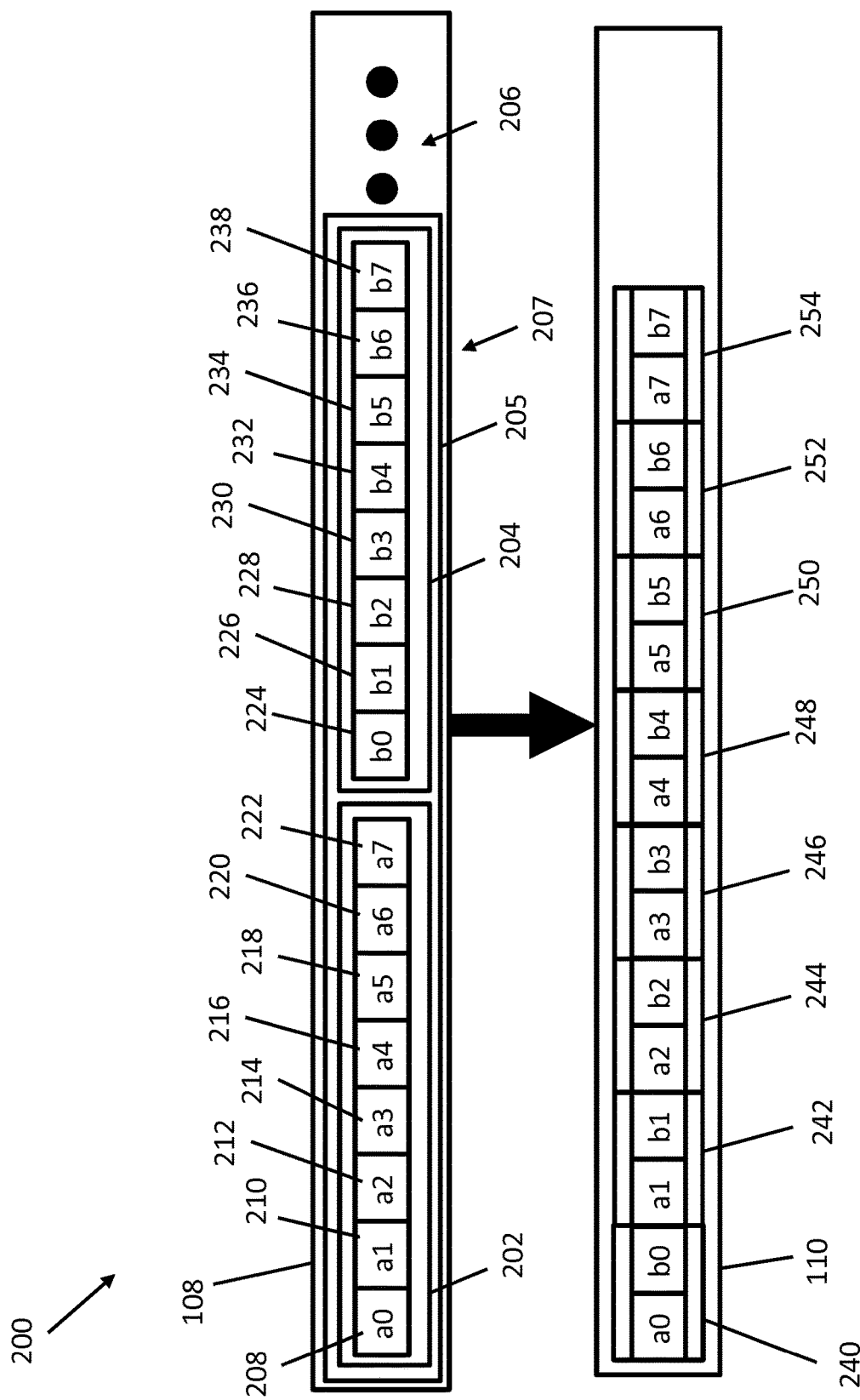
FIG. 2 is a diagram of how numeric data transmitted from the measurement device is received and rearranged by the server computing device of FIG. 1.

FIG. 2 is a diagram 200 of how numeric data 108 transmitted from measurement device 104 is received and rearranged by server computing device 102. Numeric data 108 includes at least a first number 202, followed by a second number 204, such that first number 202 and second number 204 are in sequence. First number 202 and second number 204 are, for example, floating point numbers, as described with reference to FIG. 1. In some implementations, numeric data 108 includes additional numbers 206, which are also in sequence. First number 202 includes a first byte 208, followed by a second byte 210, followed by a third byte 212, followed by a fourth byte 214, followed by a fifth byte 216, followed by a sixth byte 218, followed by a seventh byte 220, followed by an eighth byte 222. Likewise, second number 204 includes a first byte 224, followed by a second byte 226, followed by a third byte 228, followed by a fourth byte 230, followed by a fifth byte 232, followed by a sixth byte 234, followed by a seventh byte 236, followed by an eighth byte 238. In other implementations, numbers 202, 204, and 206 include a different amount of bytes than eight. In some implementations, at least first number 202 and second number 204 are included in a tuple 205. More specifically, in some implementations, first number 202 represents a first portion of tuple 205, for example an x coordinate, and second number 204 represents a second portion of tuple 205, for example a y coordinate. In other implementations, tuple 205 includes at least one additional number 206. In some implementations, tuple 205 is included in a record 207, such as a database record. In some implementations, numeric data 108 represents a plurality of such records 207.

Server computing device 102 arranges at least bytes 208, 210, 212, 214, 216, 218, 220, 222, 224, 226, 228, 230, 232, 234, 236, and 238 such that first byte 208 of first number 202 is followed by first byte 224 of second number 204. More specifically, first byte 208 of first number 202 is rearranged to be contiguous with first byte 224 of second number 204, rather than being separated from first byte 224 by intervening bytes 210, 212, 214, 216, 218, 220, 222 of first number 202. Accordingly, in rearranged numeric data 110, first byte 208 and first byte 224 are in a first set 240. Likewise, server computing device 102 stores second byte 210 of first number 202, followed by second byte 226 of second number 204 in a second set 242. Additionally, server computing device 102 stores third byte 212 of first number 202, followed by third byte 228 of second number 204 in a third set 244. Additionally, server computing device 102 stores fourth byte 214 of first number 202, followed by fourth byte 230 of second number 204 in a fourth set 246. Additionally, server computing device 102 stores fifth byte 216 of first number 202, followed by fifth byte 232 of second number 204 in a fifth set 248. Further, server computing device 102 stores sixth byte 218 of first number 202, followed by sixth byte 234 of second number 204 in a sixth set 250. Additionally, server computing device 102 stores seventh byte 220 of first number 202, followed by seventh byte 236 of second number 204 in a seventh set 252. Further, server computing device 102 stores eighth byte 222 of first number 202, followed by eighth byte 238 of second number 204 in an eighth set 254.

Although server computing device 102 rearranges bytes 208, 210, 212, 214, 216, 218, 220, 222, 224, 226, 228, 230, 232, 234, 236, and 238 to generate rearranged numeric data 110, server computing device 102 preserves the sequence of the numbers from numeric data 108. More specifically, within set 240, first byte 208 of first number 202 still precedes first byte 224 of second number 204, second byte 210 of first number 202 still precedes second byte 226 of second number 204, and so on. In some implementations, server computing device 102 stores the bytes (not shown) of one or more additional numbers 206 in each corresponding set 240, 242, 244, 246, 248, 250, 252, and 254 as well, while preserving the above-described sequence. Numeric data based on a series, such as multiples of a number (e.g., multiples of pi) or measurements (e.g., measurements of temperatures or pressures over a period of time), tend to share one or more bytes at the same position in common with adjacent numbers in the series, rather than having no similarity from one number to the next. Accordingly, for example, the most significant bytes from a first number in a series are likely to be the same as the most significant bytes from the second number in the series. By arranging the bytes as described herein, a compression algorithm, such as a Lempel-Ziv algorithm, compresses the rearranged numeric data 110 (i.e., the rearranged bytes) at a higher ratio than if the numeric data 108 was not rearranged prior to compression.

Figure 3:
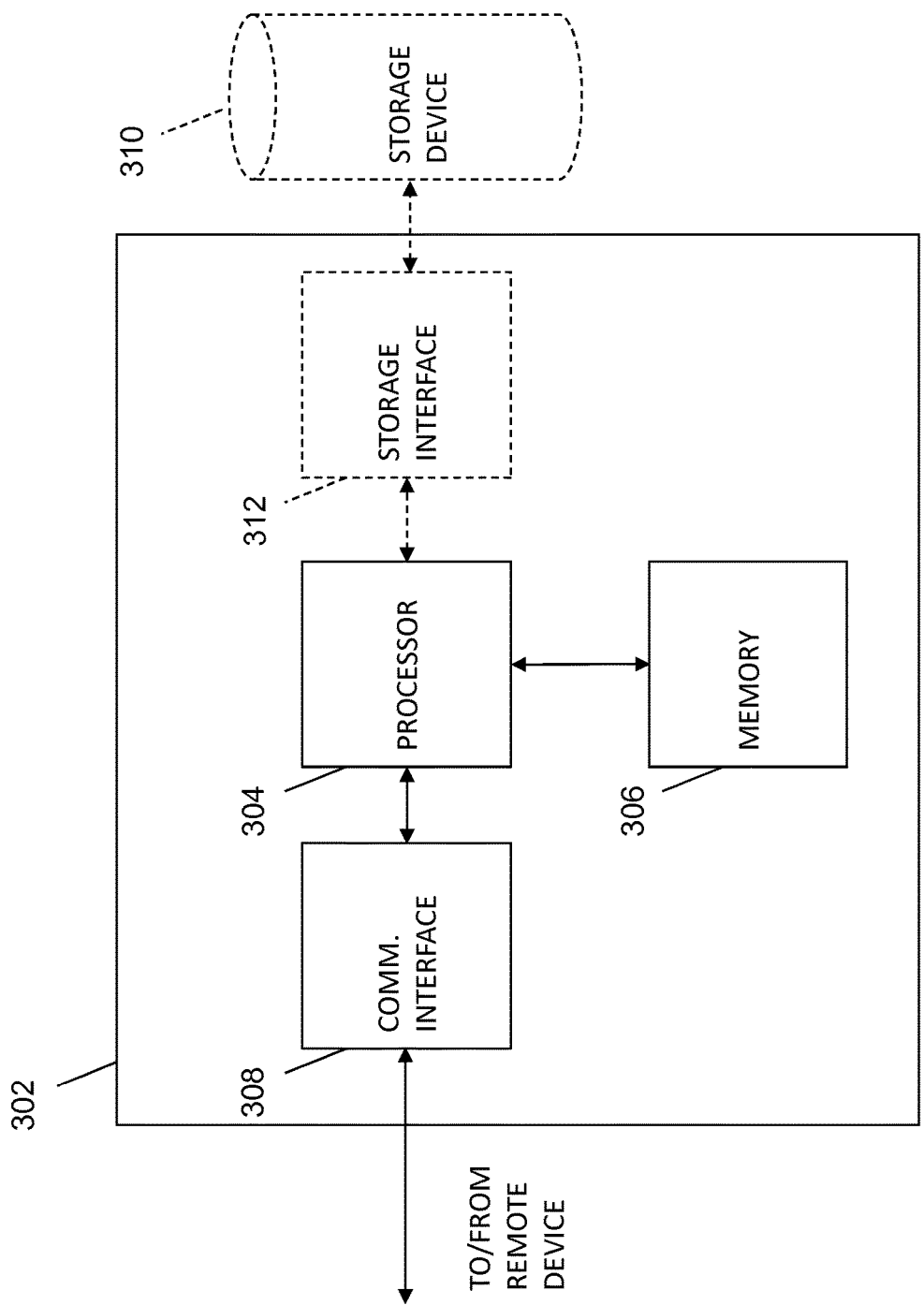
FIG. 3 illustrates a configuration of an example server computing device.

FIG. 3 illustrates an example configuration of a server computing device 302 such as server computing device 102 (shown in FIG. 1). Server computing device 302 includes one or more processors 304 for executing instructions. Instructions may be stored in one or more memory devices 306. One or more processors 304 may include one or more processing units (e.g., in a multi-core configuration).

One or more processors 304 are operatively coupled to a communication interface 308 such that server computing device 302 is capable of communicating with a remote device such as measurement device 104 and/or client computing device 106. For example, communication interface 308 may receive numeric data 108 from measurement device 104 and transmit data, such as compressed numeric data 112 to client computing device 106.

One or more processors 304 may also be operatively coupled to one or more storage devices 310. One or more storage devices 310 are any computer-operated hardware suitable for storing and/or retrieving data. In some embodiments, one or more storage devices 310 are integrated in server computing device 302. For example, server computing device 302 may include one or more hard disk drives as one or more storage devices 310. In other embodiments, one or more storage devices 310 are external to server computing device 302 and may be accessed by a plurality of server computing devices 302. For example, one or more storage devices 310 may include multiple storage units such as hard disks or solid state disks in a redundant array of inexpensive disks (RAID) configuration. One or more storage devices 310 may include a storage area network (SAN) and/or a network attached storage (NAS) system. In some embodiments, one or more storage devices 310 may include database 103.

In some embodiments, one or more processors 304 are operatively coupled to one or more storage devices 310 via a storage interface 312. Storage interface 312 is any component capable of providing one or more processors 304 with access to one or more storage devices 310. Storage interface 312 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing one or more processors 304 with access to one or more storage devices 310.

Figure 4:
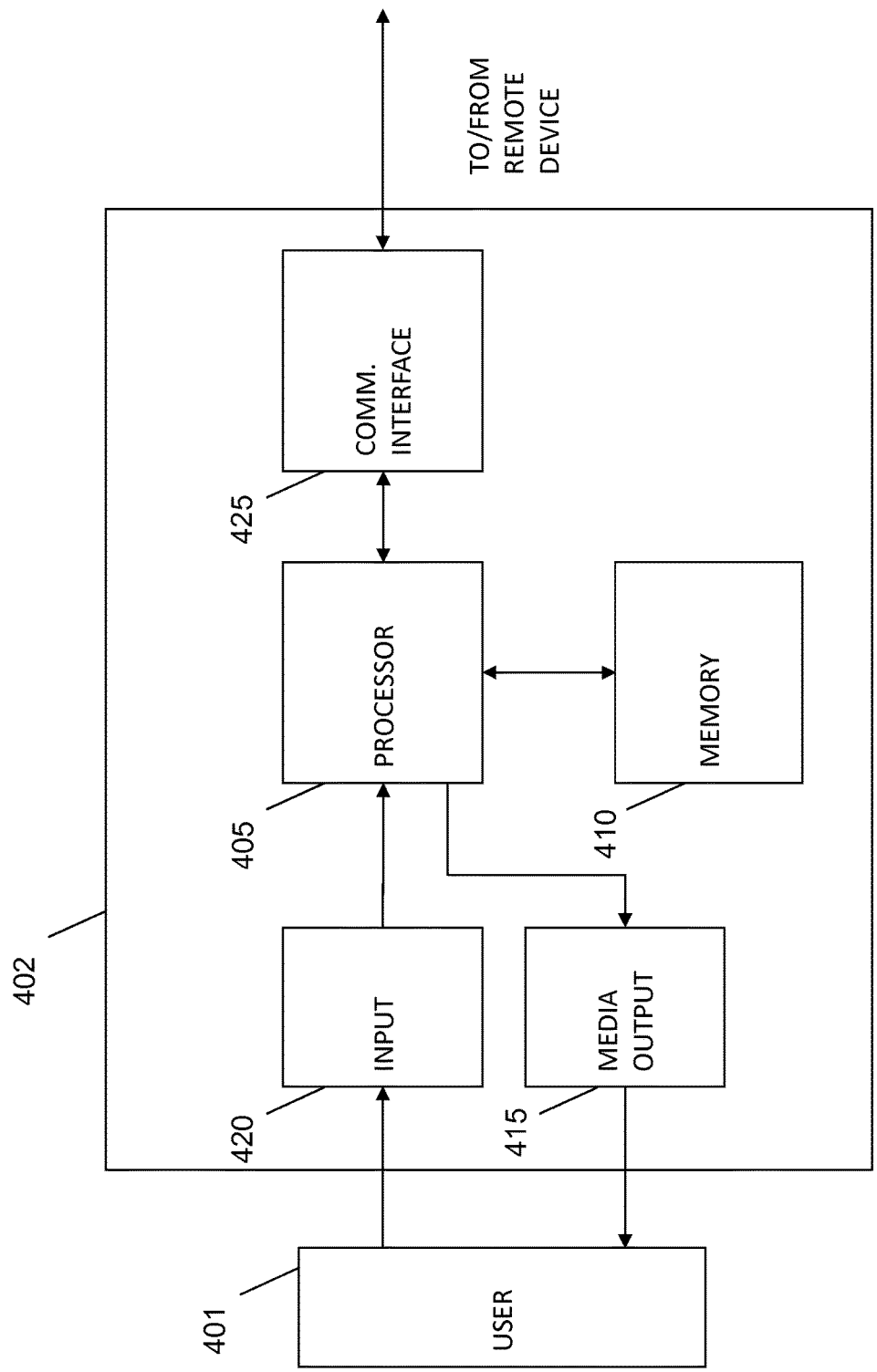
FIG. 4 illustrates a configuration of an example client computing device.

FIG. 4 illustrates an example configuration of a client computing device 402 operated by a user 401. Client computing device 402 is representative of client computing device 106 (shown in FIG. 1). In some implementations, measurement device 104 includes one or more components of client computing device 402. Client computing device 402 includes one or more processors 405 for executing instructions. In some embodiments, executable instructions are stored in a memory area 410. Processor 405 may include one or more processing units (e.g., in a multi-core configuration). One or more memory devices 410 are any one or more devices allowing information such as executable instructions and/or other data to be stored and retrieved. One or more memory devices 410 may include one or more computer-readable media.

Client computing device 402 also includes at least one media output component 415 for presenting information to user 401. Media output component 415 is any component capable of conveying information to user 401. In some embodiments, media output component 415 includes an output adapter such as a video adapter and/or an audio adapter. An output adapter is operatively coupled to processor 405 and operatively couplable to an output device such as a display device (e.g., a liquid crystal display (LCD), organic light emitting diode (OLED) display, cathode ray tube (CRT), or "electronic ink" display) or an audio output device (e.g., a speaker or headphones).

In some embodiments, client computing device 402 includes an input device 420 for receiving input from user 401. Input device 420 may include, for example, one or more of a keyboard, a pointing device, a mouse, a stylus, a touch sensitive panel (e.g., a touch pad or a touch screen), a gyroscope, an accelerometer, a position sensor, a pressure sensor, a temperature sensor, an audio input device, and a camera or other optical sensor. A single component such as a touch screen may function as both an output device of media output component 415 and input device 420.

Client computing device 402 may also include a communication interface 425, which is communicatively couplable to remote devices such as server computing device 102. Communication interface 425 may include, for example, a wired or wireless network adapter or a wireless data transceiver for use with a mobile phone network (e.g., Global System for Mobile communications (GSM), 3G, 4G or Bluetooth) or other mobile data network (e.g., Worldwide Interoperability for Microwave Access (WIMAX)).

Stored in one or more memory devices 410 are, for example, computer-readable instructions for providing a user interface (e.g., user interface 114) to user 401 via media output component 415 and, optionally, receiving and processing input from input device 420.

One or more memory devices 306 and 410 may include, but are not limited to, random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM). The above memory types are example only, and are thus not limiting as to the types of memory usable for storage of a computer program.

Figure 5:
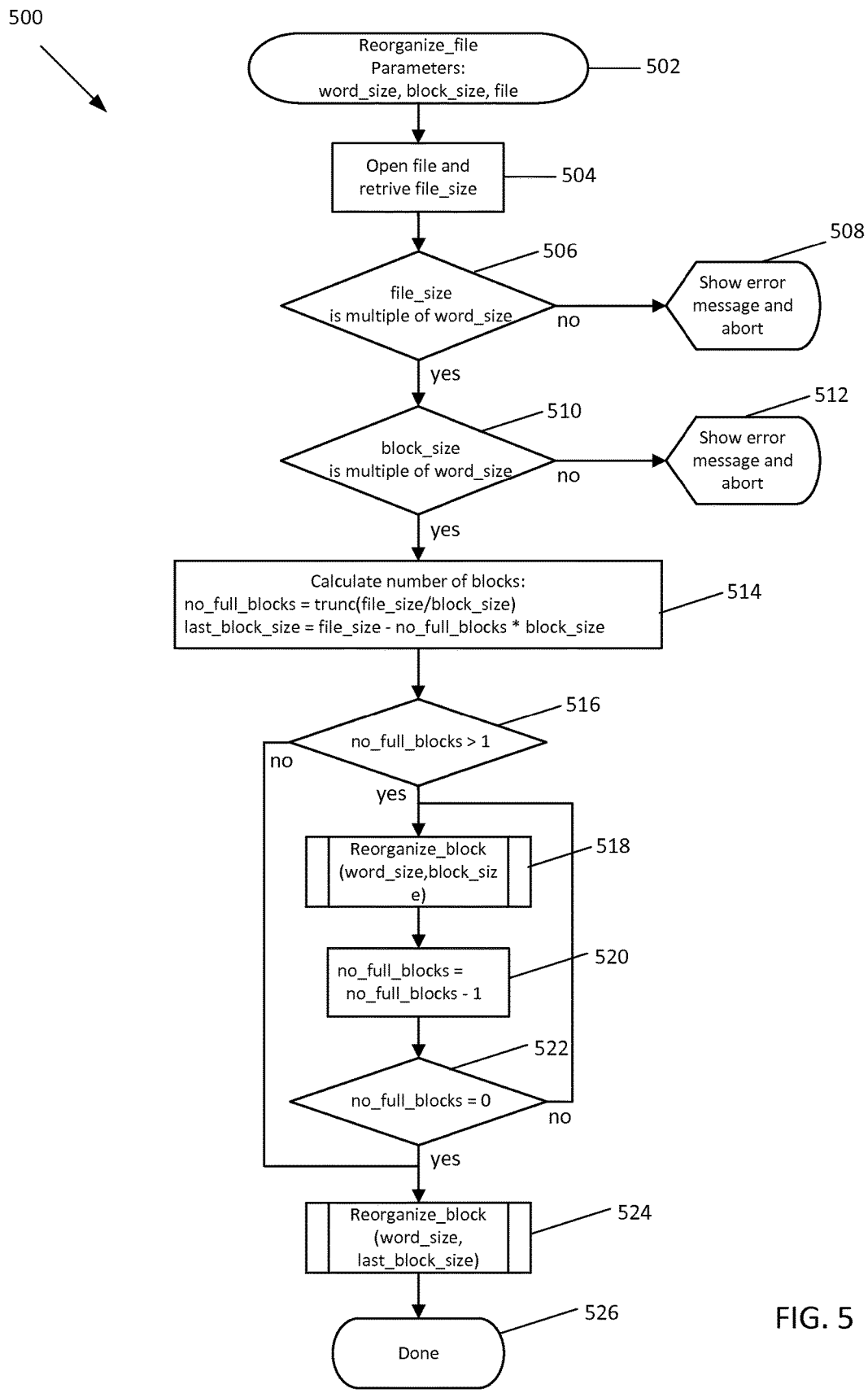
FIG. 5 is a flowchart of an example file reorganization process that may be implemented by the server computing device of FIG. 1.

FIG. 5 is a flowchart of an example file reorganization process 500 that may be implemented by server computing device 102. At step 502, server computing device 102 initiates file reorganization process 500 and receives, as parameters, a word size, a block size, and a file. For example, the word size represents a number of bytes included in each number of numeric data 108 (i.e., eight). As described above, in other implementations, the number of bytes in each number may be different than eight. The block size is a number of bytes to be read into memory 306 from the file. The file is, for example, input file 109, storing numeric data 108. At step 504, server computing device 102 opens input file 109 and retrieves a size of input file 109.

At step 506, server computing device 102 determines whether the size of input file 109 is a multiple of the word size. If not, server computing device proceeds to step 508, in which server computing device 102 outputs an error message and aborts process 500. However, if server computing device 102 determines that the size of input file 109 is a multiple of the word size, server computing device 102 proceeds to step 510, in which server computing device 102 determines whether the block size is a multiple of the word size. If server computing device 102 determines that the block size is not a multiple of the word size, server computing device 102 proceeds to step 512, in which server computing device 102 outputs an error message and aborts process 500. However, if server computing device 102 instead determines that the block size is a multiple of the word size, server computing device proceeds to step 514. In step 514, server computing device 102 calculates a number of blocks in input file 109. More specifically, server computing device 102 determines a number of full blocks by dividing the size of input file 109 by the block size. Additionally, server computing device 102 determines a size of a last block in input file 109 by multiplying the number of full blocks by the block size, and subtracting the result from the size of input file 109.

Next, server computing device 102 proceeds to step 516, in which server computing device 102 determines whether the number of full blocks is greater than one. If server computing device 102 determines that the number of full blocks is greater than one, server computing device 102 proceeds to step 518. If, on the other hand, the number of full blocks is not greater than one, server computing device 102 proceeds to step 524. In step 518, server computing device executes a block reorganization process 600, passing in the word size and the block size as parameters. Block reorganization process 600 is described in more detail with reference to FIG. 6. Next, server computing device 102 proceeds to step 520, in which server computing device 102 decrements the number of full blocks by one. Next, server computing device 102 proceeds to step 522, in which server computing device 102 determines whether the number of full blocks is equal to zero. If the number of full blocks is not equal to zero, server computing device 102 proceeds to step 518, described above. If the number of full blocks is equal to zero, server computing device proceeds to step 524. In step 524, server computing device 102 executes block reorganization process 600, passing in the word size and the last block size as parameters. Next, server computing device 102 completes process 500 at step 526.

Figure 6:
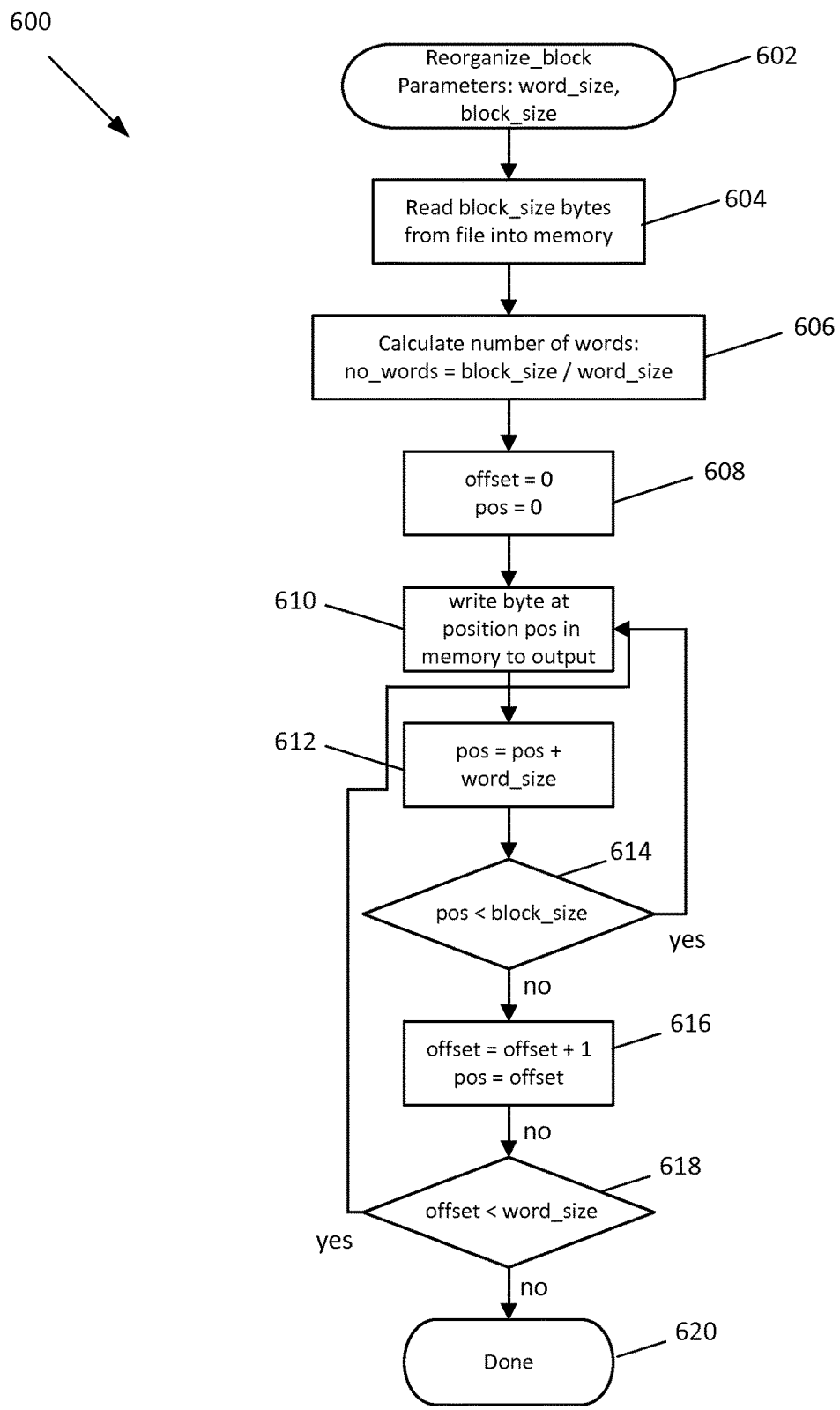
FIG. 6 is a flowchart of an example block reorganization process that may be implemented by the server computing device of FIG. 1.

FIG. 6 is a flowchart of an example block reorganization process 600 that may be implemented by server computing device 102. At step 602, server computing device 102 initiates block reorganization process 600 and receives, as parameters, the word size and the block size passed in from file reorganization process 500, described above. Next, server computing device 102 proceeds to step 604, in which server computing device 102 reads a number of bytes equal to the block size into memory 306. Next, server computing device 102 proceeds to step 606, in which server computing device 102 calculates the number of words that were read into memory 306 during step 604 by dividing the block size by the word size. For example, if server computing device 102 read in first number 202 and second number 204 from input file 109, the word size would be eight, the block size would be 16, and the number of words would be two.

Next, server computing device 102 proceeds to step 608, in which server computing device 102 sets an offset to zero and a position to zero. Next, server computing device 102 proceeds to step 610, in which server computing device 102 writes the byte from the block read into memory 306 at step 604 to an output location, such as intermediate file 111 (FIG. 1). Next, server computing device 102 proceeds to step 612, in which server computing device 102 increments the position by the word size. Next, server computing device 102 proceeds to step 614, in which server computing device 102 determines whether the position is less than the block size. If the position is less than the block size, then server computing device 102 proceeds to step 610, described above. If the position is not less than the block size, then server computing device 102 proceeds to step 616.

In step 616, server computing device 102 increments the offset by one and sets the position equal to the offset. Next, server computing device 102 proceeds to step 618, in which server computing device 102 determines whether the offset is less than the word size. If the offset is less than the word size, then server computing device 102 proceeds to step 610, described above. However, if the offset is not less than the word size, then server computing device 102 proceeds to step 620, where server computing device 102 completes process 600. By performing file reorganization process 500 and block reorganization process 600 described above, server computing device 102 rearranges numeric data 108 into rearranged numeric data 110.

Figure 7:
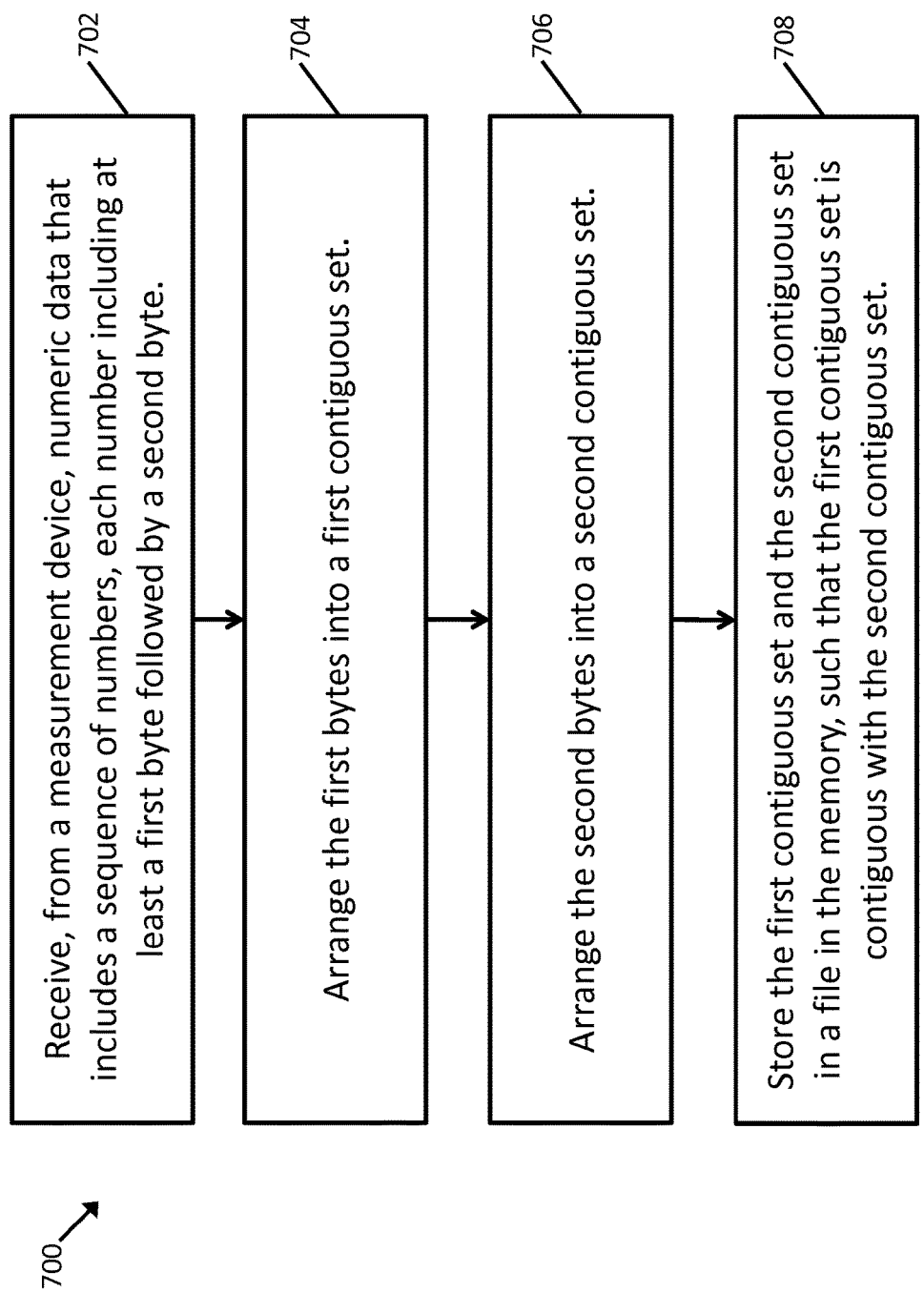
FIG. 7 is a flowchart of an example process for arranging numeric data for compression that may be implemented by the server computing device of FIG. 1.

FIG. 7 is a flowchart of a process 700 implemented by server computing device 102 for arranging numeric data 108 for compression. Initially, server computing device 102 receives 702, from a measurement device (e.g., measurement device 104), numeric data (e.g., numeric data 108) that includes a sequence of numbers (e.g., first number 202 and second number 204). Each number (e.g., first number 202 and second number 204) includes at least a first byte (e.g., first byte 208 of first number 202 and first byte 224 of second number 204), followed by a second byte (e.g., second byte 210 of first number 202 and second byte 226 of second number 204). Additionally, server computing device 102 arranges 704 the first bytes (e.g., first byte 208 and first byte 224) into a first contiguous set (e.g., first set 240). Additionally, server computing device 102 arranges 706 the second bytes (e.g., second byte 210 and second byte 226) into a second contiguous set (e.g., second set 242). Additionally, server computing device 102 stores 708 the first contiguous set (e.g., first set 240) and the second contiguous set (e.g., second set 242) in a file (e.g., intermediate file 111) in memory (e.g., memory 306) such that the first contiguous set (e.g., first set 240) is contiguous with the second contiguous set (e.g., second set 242).

In some implementations, server computing device 102 additionally compresses the file (e.g., intermediate file 111), thereby generating compressed file 113. In some implementations, server computing device compresses the file (e.g., intermediate file 111) using a Lempel-Ziv algorithm. In some implementations, server computing device 102 transmits compressed file 113 to a client computing device (e.g., client computing device 106) for display thereon, for example in user interface 114. In some implementations, server computing device 102 is configured such that receiving numeric data 108 includes receiving floating point numbers. In some implementations, server computing device 102 is configured such that arranging the first bytes (e.g., first byte 208 and first byte 224) into a first contiguous set (e.g., first set 240) further includes arranging the first bytes in accordance with the sequence, such that a first byte of a first number (e.g., first byte 208 of first number 202) in the sequence is followed by a first byte of a second number in the sequence (e.g., first byte 224 of second number 204), and arranging the second bytes in accordance with the sequence, such that a second byte of the first number (e.g., second byte 210 of first number 202) is followed by a second byte of the second number (e.g., second byte 226 of second number 204).

In some implementations, server computing device 102 is further configured such that receiving numeric data 108 further includes receiving a plurality of records 207, wherein each record 207 comprises a tuple 205 of numeric data 108. In some implementations, server computing device 102 is further configured such that arranging the first bytes and arranging the second bytes further includes arranging the first bytes and arranging the second bytes within each record 207 of the plurality of records. In some implementations, each number (e.g., first number 202 and second number 204) includes eight bytes.

Figure 8:
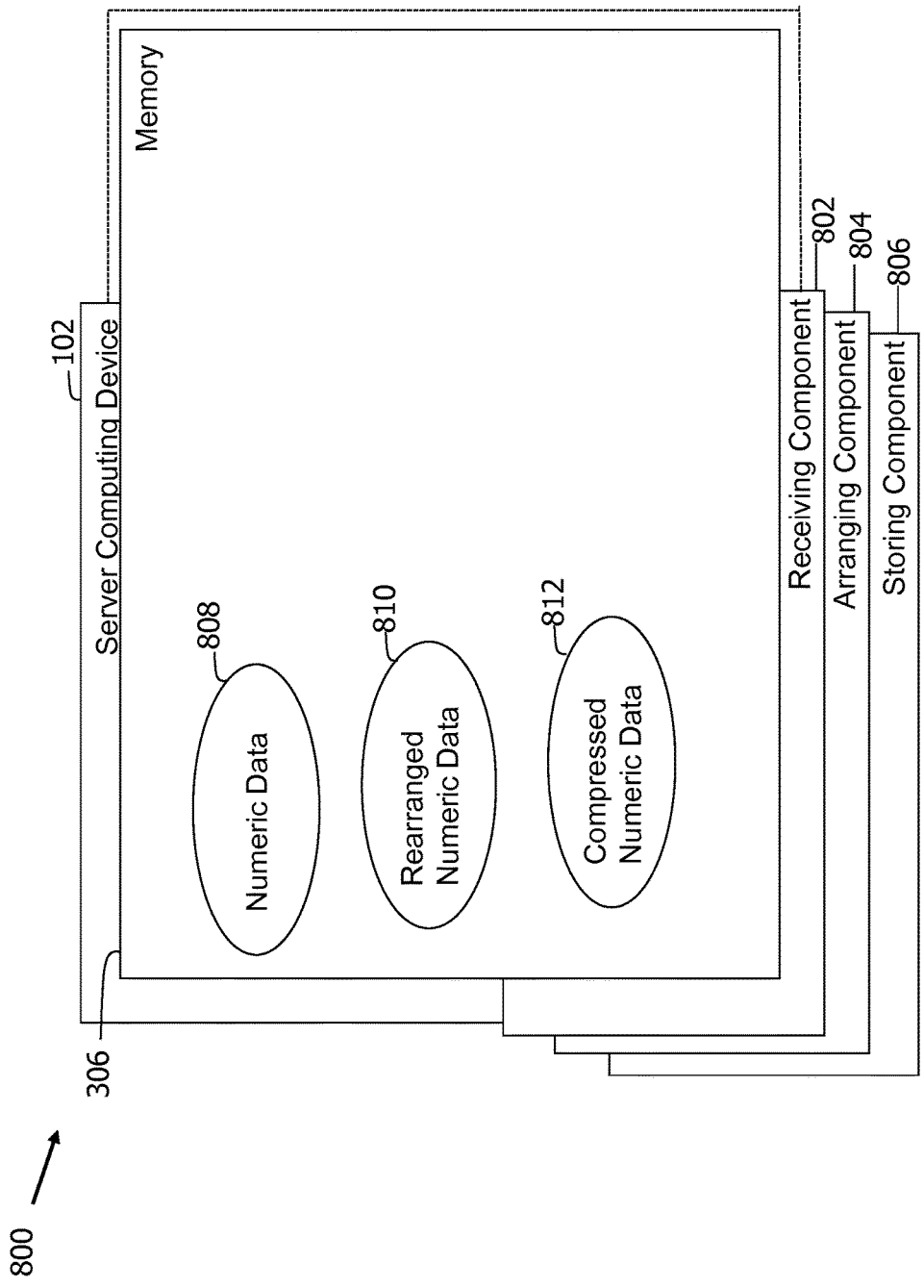
FIG. 8 is a diagram of components of one or more example computing devices that may be used in embodiments of the described systems and methods.

FIG. 8 is a diagram 800 of components of one or more example computing devices, for example server computing device 102, that may be used in embodiments of the described systems and methods. FIG. 8 further shows a configuration of data in memory 306 (FIG. 3).

Server computing device 102 includes a receiving component 802 for receiving, from measurement device 104, numeric data that includes a sequence of numbers, each number including at least a first byte followed by a second byte. Server computing device 102 additionally includes an arranging component 804 for at least arranging the first bytes into a first contiguous set and the second bytes into a second contiguous set. Additionally, server computing device 102 includes a storing component 806 for storing the first contiguous set and the second contiguous set in a file in the memory, such that the first contiguous set is contiguous with the second contiguous set. In an example embodiment, data in memory 306 is divided into a plurality of sections, including but not limited to, a numeric data section 808, a rearranged numeric data section 810, and a compressed numeric data section 812. These sections within memory 306 are interconnected to retrieve and store information in accordance with the functions and processes described above.

A technical effect of systems and methods described herein includes at least one of: (a) receiving, from a measurement device, numeric data that includes a sequence of numbers, each number including at least a first byte followed by a second byte; (b) arranging the first bytes into a first contiguous set; (c) arranging the second bytes into a second contiguous set; and (d) storing the first contiguous set and the second contiguous set in a file in a memory, such that the first contiguous set is contiguous with the second contiguous set.

As compared to known systems and methods for compressing numeric data, the systems and methods described above provide the technical effect of enabling increased compression ratios for numeric data. Accordingly, systems that store and/or transmit numeric data may operate more efficiently, requiring less storage space and bandwidth than known systems.

The term processor, as used herein, refers to central processing units, microprocessors, microcontrollers, reduced instruction set circuits (RISC), application specific integrated circuits (ASIC), logic circuits, and any other circuit or processor capable of executing the functions described herein.

As used herein, the terms "software" and "firmware" are interchangeable, and include any computer program stored in memory for execution by processor 405 including RAM memory, ROM memory, EPROM memory, EEPROM memory, and non-volatile RAM (NVRAM) memory. The above memory types are example only, and are thus not limiting as to the types of memory usable for storage of a computer program.

As will be appreciated based on the foregoing specification, the above-discussed embodiments of the disclosure may be implemented using computer programming or engineering techniques including computer software, firmware, hardware or any combination or subset thereof. Any such resulting computer program, having computer-readable and/or computer-executable instructions, may be embodied or provided within one or more computer-readable media, thereby making a computer program product, i.e., an article of manufacture, according to the discussed embodiments of the disclosure. These computer programs (also known as programs, software, software applications or code) include machine instructions for a programmable processor, and can be implemented in a high-level procedural and/or object-oriented programming language, and/or in assembly/machine language. As used herein, the terms "machine-readable medium," "computer-readable medium," and "computer-readable media" refer to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The "machine-readable medium," "computer-readable medium," and "computer-readable media," however, do not include transitory signals (i.e., they are "non-transitory"). The term "machine-readable signal" refers to any signal used to provide machine instructions and/or data to a programmable processor.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. A computer-implemented method for arranging floating point numeric data for compression, said method implemented using a computing device in communication with a memory and a measurement device, said method comprising:
   receiving, by the computing device and from the measurement device, numeric data that includes a plurality of floating point numbers in a sequence, each floating point number including at least a first byte followed by a second byte;
   arranging the first byte of each floating point number into a first set, wherein the first bytes are arranged contiguous to each other in the first set, and a position of the first byte of each floating point number in the first set matches said floating point number's position in the sequence;
   arranging the second byte of each floating point number into a second set, wherein the second bytes are arranged contiguous to each other in the second set, and a position of the second byte of each floating point number in the second set matches said floating point number's position in the sequence; and
   storing the first set and the second set in a file in the memory, such that the first set is contiguous with the second set.

2. The method of claim 1, further comprising compressing the file.

3. The method of claim 2, wherein compressing the file further comprises compressing the file using a Lempel-Ziv algorithm.

4. The method of claim 2, further comprising transmitting the compressed file to a client computing device for display thereon.

5. The method of claim 1, wherein receiving the numeric data further comprises receiving a plurality of records, wherein each record comprises a tuple of numeric data.

6. The method of claim 5, wherein arranging the first byte and arranging the second byte further comprises arranging the first byte and arranging the second byte within each record of the plurality of records.

7. The method of claim 1, wherein each number comprises eight bytes.

8. A system for arranging floating point numeric data for compression, said system comprising a computing device coupled to a memory, said computing device configured to:
   receive, from the measurement device, numeric data that includes a plurality of floating point numbers in a sequence, each floating point number including at least a first byte followed by a second byte;
   arrange the first byte of each floating point number into a first set, wherein the first bytes are arranged contiguous to each other in the first set, and a position of the first byte of each floating point number in the first set matches said floating point number's position in the sequence;
   arrange the second byte of each floating point number into a second set, wherein the second bytes are arranged contiguous to each other in the second set, and a position of the second byte of each floating point number in the second set matches said floating point number's position in the sequence; and
   store the first set and the second set in a file in the memory, such that the first set is contiguous with the second set.

9. The system of claim 8, wherein said computing device is further configured to compress the file.

10. The system of claim 9, wherein said computing device is further configured to compress the file using a Lempel-Ziv algorithm.

11. The system of claim 9, wherein said computing device is further configured to transmit the compressed file to a client computing device for display thereon.

12. The system of claim 8, wherein said computing device is further configured to receive the numeric data by receiving a plurality of records, wherein each record comprises a tuple of numeric data.

13. The system of claim 12, wherein said computing device is further configured to arrange the first bytes and arrange the second bytes by arranging the first bytes and arranging the second bytes within each record of the plurality of records.

14. A non-transitory computer-readable storage medium having computer-executable instructions embodied thereon, wherein when executed by a computing device having a processor in communication with a memory, the computer-executable instructions cause the computing device to:

receive, from the measurement device, numeric data that includes plurality of floating point numbers in a sequence, each floating point number including at least a first byte followed by a second byte;

arrange the first byte of each floating point number into a first set, wherein the first bytes are arranged contiguous to each other in the first set, and a position of the first byte of each floating point number in the first set matches said floating point number's position in the sequence;

arrange the second byte of each floating point number into a second set, wherein the second bytes are arranged contiguous to each other in the second set, and a position of the second byte of each floating point number in the second set matches said floating point number's position in the sequence; and store the first set and the second set in a file in the memory, such that the first set is contiguous with the second set.

15. The non-transitory computer-readable storage medium of claim 14, wherein said instructions further cause the computing device to compress the file using a Lempel-Ziv algorithm.

* * * * *